United States Patent
Kawashima et al.

(10) Patent No.: US 6,669,077 B1
(45) Date of Patent: Dec. 30, 2003

(54) HIGH-STRENGTH SOLDER JOINT

(75) Inventors: Kazuyuki Kawashima, Tokyo (JP); Yasunori Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/653,865

(22) Filed: Sep. 1, 2000

(30) Foreign Application Priority Data

Sep. 3, 1999 (JP) .......................................... 11-250152

(51) Int. Cl.[7] .......................... B23K 31/02; C22C 13/00
(52) U.S. Cl. .................. 228/180.21; 228/245; 228/249; 228/256; 420/560
(58) Field of Search .............................. 228/245, 246, 228/247, 248.1, 248.5, 249, 250, 251, 252, 253, 254, 255, 256, 257, 258, 259, 260, 261, 262, 180.21; 427/96; 420/560, 557

(56) References Cited

U.S. PATENT DOCUMENTS

| | | | | |
|---|---|---|---|---|
| 4,871,108 A | * | 10/1989 | Boecker et al. ............. 228/122 |
| 5,199,487 A | * | 4/1993 | DiFrancesco et al. ........ 165/468 |
| 5,260,234 A | * | 11/1993 | Long ........................... 437/203 |
| 5,492,863 A | * | 2/1996 | Higgins, III ................ 437/183 |
| 6,137,690 A | * | 10/2000 | Carson et al. ............... 361/779 |
| 6,175,152 B1 | * | 1/2001 | Toyoda ........................ 257/690 |
| 6,224,690 B1 | * | 5/2001 | Andricacos et al. ........ 148/400 |

FOREIGN PATENT DOCUMENTS

| | | |
|---|---|---|
| JP | 9-326554 | 12/1997 |
| JP | 11-077371 | 3/1999 |

* cited by examiner

Primary Examiner—M. Alexandra Elve
Assistant Examiner—Len Tran
(74) Attorney, Agent, or Firm—Young & Thompson

(57) ABSTRACT

A soldering method achieving a high-strength joint between a solder and an nickel/gold electroless plated surface is disclosed. The nickel/gold electroless plated layer is soldered using a solder including tin (Sn), silver (Ag), and copper (Cu). At a solder joint, a layer sturcture of nickel layer/intermetallic compound layer/solder layer is formed. The intermetallic compound layer is composed mainly of tin (Sn) and copper (Cu), and further including nickel (Ni). The intermetallic compound layer has cauliflower-shaped surfaces formed in a solder-layer's side thereof.

12 Claims, 9 Drawing Sheets

HIGH-STRENGTH SOLDER JOINT

BACKGROUND OF THE INVENTION

1. Field of the invention

The present invention generally relates to soldering techniques, and in particular to a soldering method for a nickel/gold electroless plated surface. The present invention can be applied to a wiring structure, a circuit, and a method for manufacturing the same.

2. Description of the Related Art

Soldering is used to not only electrically connect an electronic device to a printed circuit substrate but also mechanically fix it to the printed circuit substrate Therefore, to ensure a sufficient strength at a solder Joint is one of the important issues in the field of mounting techniques.

In the case of an electronic device of relatively large in size, the electrode area thereof to be soldered, that is, solder-contact area, is also relatively large and therefore the strength of a solder joint is not a significant issue in design. Since a mechanically sufficient solder joint strength is achieved in the case of a relatively large sized device, Sn-Pb eutectic solder has been widely used because of an easy-to-handle material with a low melting point. It should be noted that Sn-Pb eutectic solder itself does not have an excellent mechanical strength.

However, in the case of an electronic device of very small size, such as CSP (Chip Size Package), the electrode area thereof to be soldered, that is, solder-contact area, is also very small. Needless to say, the area of a pad on a printed circuit substrate must also be reduced so as to fit with the external electrodes of a CSP-type device.

For example, in the case where a BGA (Ball Grid Array)-type package with 0.8 mm pitches and each solder ball approximately 0.5 mm in diameter is mounted on a printed circuit substrate, it is necessary to reduce the diameter of a pad on the printed circuit substrate to 0.4 mm. The area of such a pad 0.4 mm in diameter is only a fraction of the area of a pad on a printed circuit substrate to be mounted with a conventional 0.5 mm-pitch QFP (Quad Flat Package)

The more an electronic device is miniaturized, the smaller the electrode area of a contact area to be soldered, that is, solder-contact area. Therefore, the strength of a solder joint becomes a significant issue in design.

In general, a wiring conductor is made of copper (Cu) or aluminum (Al). However, it cannot be said that copper and aluninum essentially lend themselves to use for soldering and further these materials may rust before soldering. To make the to-be-soldered surface of a wiring conductor suitable for soldering and prevent it from rust, therefore, surface treatment such as solder plating or, in these years, nickel/gold plating, is usually made on the necessary surface of the wiring conductor.

Since electroplating needs special wires for electroplating on a package and a printed circuit substrate, the recent trend is to replace electroplating with electroless plating. As electroless plating, in general, nickel-phosphorus plating is employed for nickel plating. Hereafter, a nickel/gold-plated layer, in which a nickel layer is formed by nickel-phosphorus electroless plating, is called "nickel/gold electroless plated layer".

The Inventor, however, found that a nickel/gold electroless plated layer has less mechanical strength. For example, in the case where a CSP device with 0.8 mm pitches and each Sn-Pb eutectlc solder ball being 0.5 mm in diameter is soldered to respective nickel/gold electroless plated pads on a printed circuit substrate, it is observed that the solder is peeled from the boundary surface of the nickel layer.

As one of protection methods to avoid such destructive peeling phenomenon, a space between the CSP device and the printed circuit substrate is filled with an adhesive. However, this method is costly.

As another protection method, a larger soldered area is intentionally formed to increase in mechanical strength at a solder joint. For example, large size reinforcing electrodes are formed in advance and, by soldering these reinforcing electrodes, sufficient mechanical strength can be obtained. However, these large size reinforcing electrodes blocks miniaturization, which is the most important feature of CSP.

As still another protection method, it is considered that the solder plating is employed in place of the nickel/gold electroless plating. However, the solder plating provides less smoothness after plating, resulting in unstable mounting of parts. This may cause manufacturing yield to be reduced. Such a disadvantage is more significant because the electrode area of a contact area to be soldered becomes smaller with recent advances in miniaturization.

As further another protection method, it is considered that a coating of organic compound is employed. However, an organic compound coating cannot prevent the conductor from rust for a sufficiently long time.

As described above, as of now, freedom of choice is limited to selecting the nickel/gold electroless plating.

SUMMARY OF THE INVENTION

An object of the present invention is to provide a soldering method achieving a high-strength joint between a solder and an nickel/gold electroless plated surface.

According to a first aspect of the present invention, a soldering method comprising the step of: preparing a nickel/gold electroless plated layer composed of a nickel layer formed by nickel-phosphorus electroless plating and a gold layer formed on the nickel layer; and soldering the nickel/gold electroless plated layer using a solder including tin (Sn), silver (Ag), and copper (Cu).

The composition of the solder may be Sn—3.5 Ag—0.75 Cu % by weight but not limited to that composition.

According to a second aspect of the present invention, a soldering method comprising the step of: preparing a nickel/gold electroless plated layer composed of a nickel layer formed by nickel-phosphorus electroless plating and a gold layer formed on the nickel layer; and soldering the nickel/gold electroless plated layer using a solder so that an intermetallic compound is formed at an interface surface between the nickel layer and the solder, wherein the intermetallic compound is shaped like a cauliflower.

The intermetallic compound may be composed mainly of tin (Sn) and copper (Cu), further including nickel (Ni).

The gold layer may be formed by displacement plating,

According to a third aspect of the present invention, a solder joint between a solder and a conductor terminal formed on a wiring structure, is comprised of: a nickel layer formed by nickel-phosphorus electroless plating on the conductor terminal: an intermetallic compound layer formed on the nickel layer, the intermetallic compound layer including tin (Sn), copper (Cu), and nickel (Ni); and a solder layer formed on the intermetallic compound layer, the solder layer including tin (Sn), silver (Ag), and copper (Cu).

The intermetallic compound may be composed mainly of tin (Sn) and copper (Cu).

The intermetallic compound layer may have cauliflower-shaped surfaces formed in a solder-layer's side thereof.

According to a fourth aspect of the present invention, a solder Is comprised of: a nickel layer formed by nickel-phosphorus electroless plating on the conductor terminal; an intermetallic compound layer formed on the nickel layer; and a solder layer formed on the intermetallic compound layer. The intermetallic compound layer has cauliflower-shaped surfaces formed in a solder-layer's side thereof.

The present invention can be applied to a wiring structure having a plurality of conductor terminals formed thereon, each of which is soldered to form the solder joint. This solder joint can be formed according to the above-described aspects of the present invention.

The present invention can be applied to a device including a wiring substrate having a plurality of substrate terminals formed thereon; and a functional circuit having a plurality of circuit terminals, wherein the substrate terminals are soldered to respective ones of the circuit terminals at solder joints. Each of the solder joints can be formed according to the above-described aspects of the present invention.

The present invention can be applied to a device including a printed circuit substrate having a plurality of substrate terminals formed thereon; and a semiconductor chip package having a plurality of package terminals, wherein the substrate terminals are soldered to respective ones of the package terminals at solder joints. Each of the solder joints can be formed according to the above-described aspects of the present invention.

DETAILED DESCRIPTION OF THE PREFERRED EMBODIMENTS

A nickel/gold electroless plated layer is defined as a layer composed of a nickel layer and a gold layer formed on the nickel layer, where the nickel layer is formed by the well-known nickel-phosphorus electroless plating.

According to an embodiment of the present invention, a solder including tin (Sn), silver (Ag), and copper (Cu) is used to perform soldering for a nickel/gold electroless plated layer. For example, an Sn—3.5 Ag—0.75 Cu % by weight solder may be used in this embodiment. Since a pad made of copper (Cu) on a printed circuit substrate has a nickel/gold electroless plated layer formed thereon to prevent rust or the like, soldering with the Sn—Ag—CU solder is performed directly on the nickel/gold electroless plated layer. As described later, when soldering, the gold layer of the nickel/gold electroless plated layer is melted into the Sn—Ag—CU solder. Using an Sn—Ag—CU solder for the nickel/gold electroless plated layer results in a high-strength solder joint. The details will be described hereafter.

Figure 1:
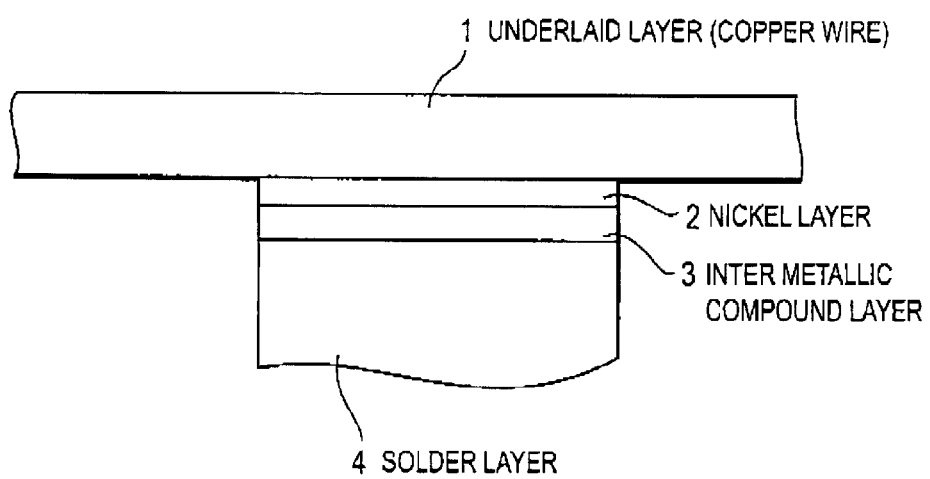
FIG. 1 is a schematic diagram showing a layer structure of a solder joint according to an embodiment of the present invention.

As shown in FIG. 1, a solder joint according to the embodiment is composed of a layer structure: an underlaid layer 1 (here, a copper wire)/nickel layer 2/intermetallic compound layer 3/solder layer 4. The gold layer of the nickel/gold electroless plated layer has been melted into the solder. The lntermetallic compound layer 3 is composed mainly of tin and copper, further including nickel. The details of an intermetallic compound will be described later.

Such a solder joint according to the embodiment was subject to the destructive lifetime Inspection. The result was that the strength of the solder joint was high and thereby destructive peel at the boundary surface between the nickel layer 2 and the intermetallic compound layer 3 was hard to occur. Therefore, a reliable solder joint can be obtained. The details of the destructive lifetime inspection will be described later.

Figure 2:
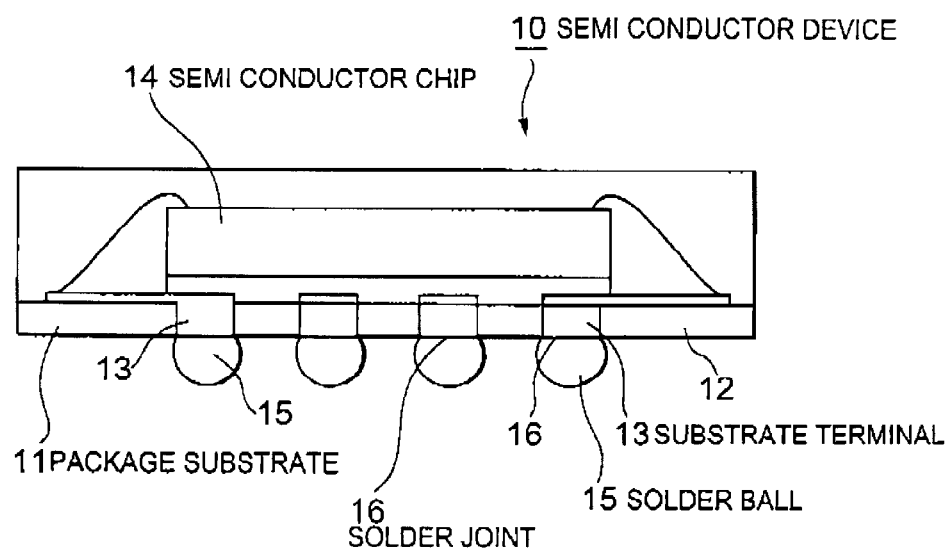
FIG. 2 is a diagram showing a semiconductor device to which the embodiment of the present invention is applied.

Referring to FIG. 2, a semiconductor device 10 is composed of a BGA-type package substrate 11 mounted with a semiconductor chip 14. The package substrate 11 has interconnections 12 formed thereon and substrate terminals 13 connected to respective ones of the interconnections 12. Further, the package substrate 11 has solder balls formed on respective ones of the substrate terminals 13.

As described before, the nickel/gold electroless, plated layers exist on respective ones of the substrate terminals 13 before the solder balls are formed. Each of solder joints 16 after the solder balls have been formed has the layer structure as shown in FIG. 1.

The semiconductor device 10 may be also mounted to a printed circuit board (not shown). Each terminal on the printed circuit board may have the nickel/gold electroless plated layer formed on the surface thereof before soldering the semiconductor device 10 to the printed circuit board.

Figure 3:
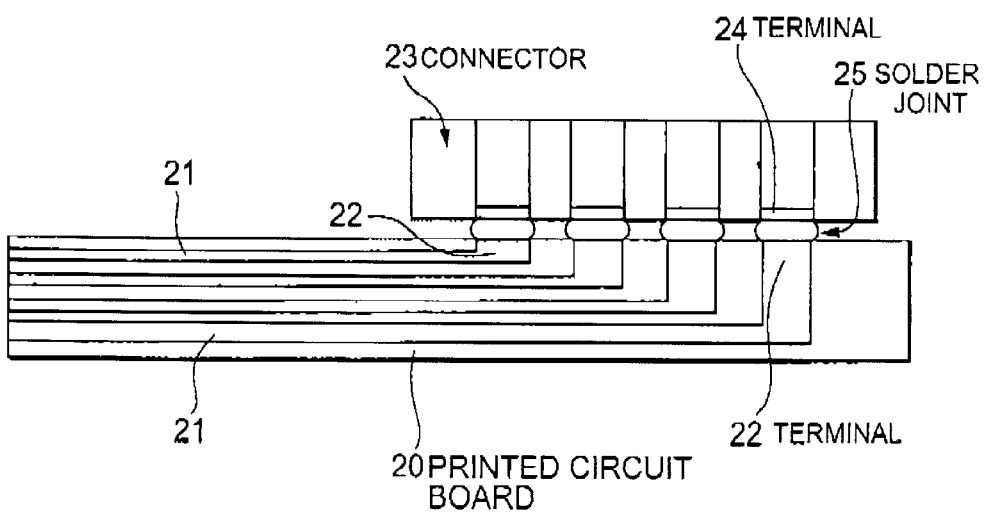
FIG. 3 is a diagram showing a wiring structure to which the embodiment of the present invention is applied.

Referring to FIG. 3, a wiring structure is composed of a printed circuit board 20 mounted with a connector 23. The printed circuit board 20 has wires 21 therein and terminals 22 connected to respective ones of the wires 21. The connector 23 has terminals 24. The respective terminals 22 are electrically and mechanically connected to the terminals 24 of the connector 23 by solder joints 25. Each terminal 22 and 24 has the nickel/gold electroless plated layer formed on the surface thereof before soldering the connector 23 to the printed circuit board 20. Therefore, a Sn—Ag—CU solder is used to form the solder joints 25, each side of which has the layer structure as shown in Fig. 1, resulting in a high-strength solder joint.

As described above, a high-strength solder joint for a nickel/gold electroless plated surface can be obtained, which improves the reliability of a structure such as a semiconductor device 10 or a wiring structure including the package substrate 11 and the printed circuit board 20 mounted with the connector 23.

The inventors have pursued a mechanism providing such a high solder joint strength. A part of analysis of the mechanism will be described hereafter.

There have been known the following combinations providing a high strength at a solder joint:
(1) Sn-Pb eutectic solder and copper foil:
(2) Sn-Pb eutectlc solder and solder-plated copper foil; and
(3) Sn-Pb eutectic solder and nickel/gold electro-plated copper foil, where copper foil is, for example, a copper wire formed on a printed circuit substrate.

In the cases (1) and (2), an intermetallic compound of copper and tin is formed at a boundary surface between the Sn-Pb eutectic solder and the copper foil. In the case (3), an intermetallic compound of nickel and tin is formed at a boundary surface between the Sn-Pb eutectic solder and the nickel/gold electroplated copper toll.

Figure 4:
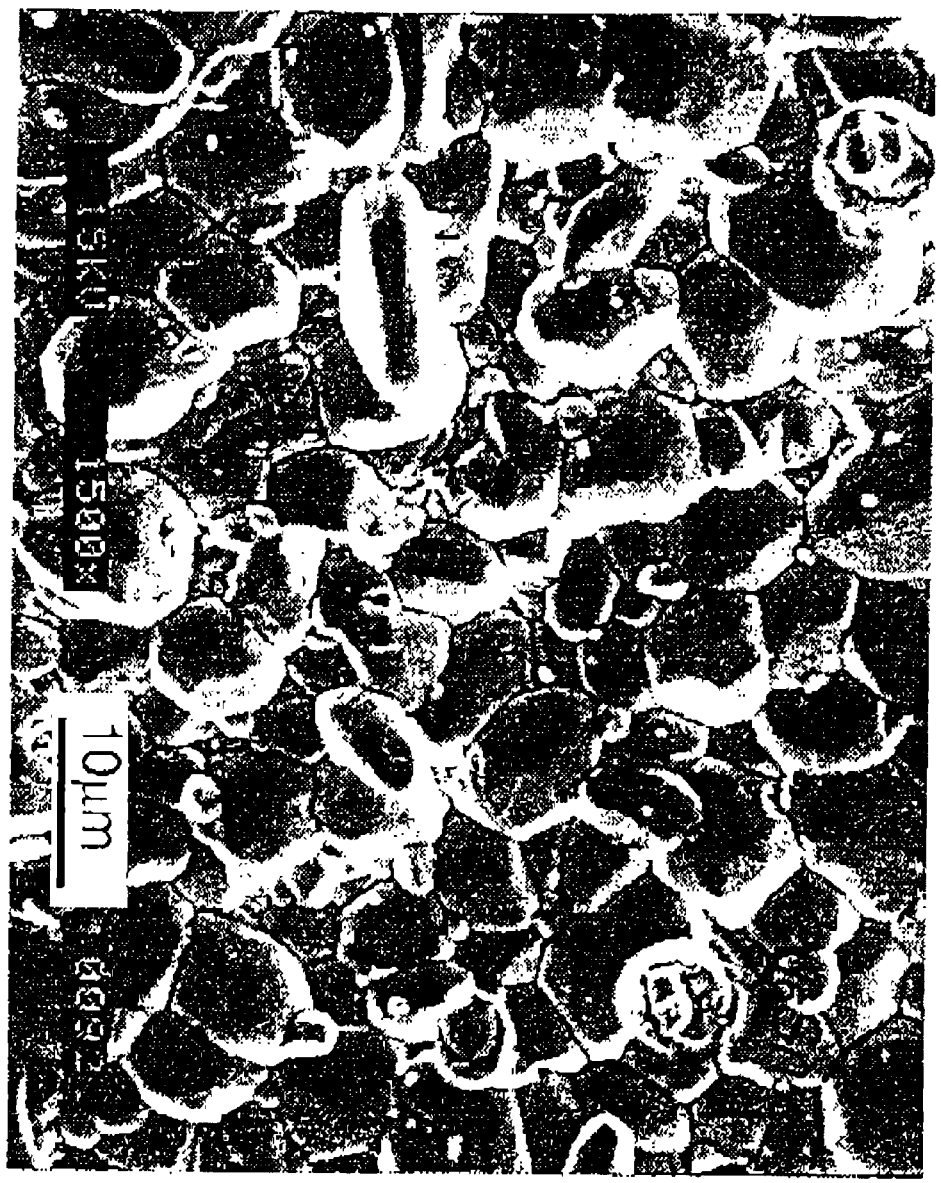
FIG. 4 is a diagram showing an appearance of an intermetallic compound formed from a Cu piece and an Sn-Pb eutectic solder.
Figure 5:
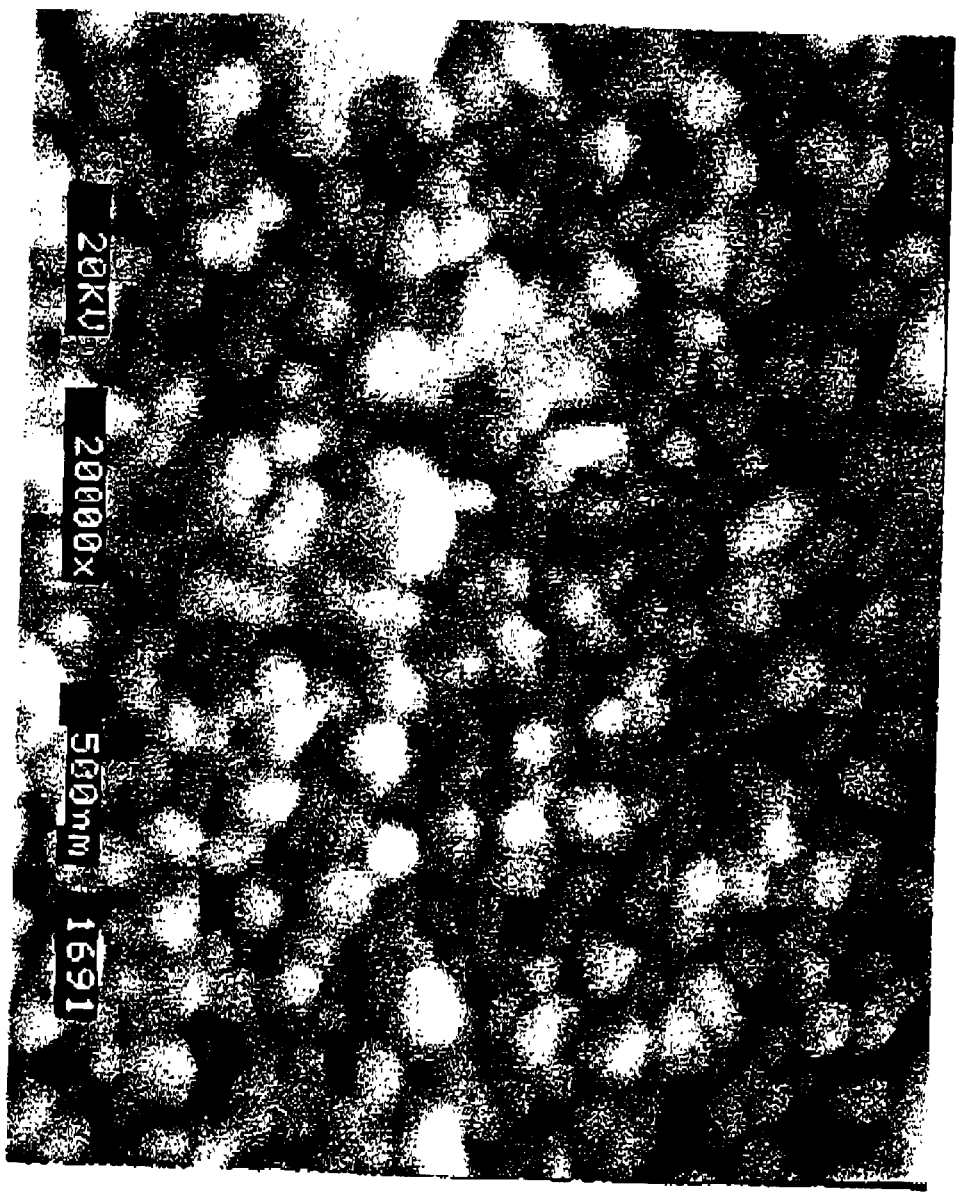
FIG. 5 is a diagram showing an appearance of an intermetallic compound formed from a nickel/gold electro plated surface and Sn-Pb eutectic solder.

The inventors observed the respective appearances of intermetallic compounds formed in the above three cases (1)–(3) to find the cause of the differences in mechanical strength. Since an intermetalllc compound has been formed in the solder joint, the observation is made after the intermetallic compound is exposed by dissolving the solder component of the solder joint using a chemical agent. As the result, the inventors found that the lntermetallic compound has been shaped like a cauliflower in the solder joint in all the cases (1)–(3). FIG. 4 shows an appearance of an intermetallic compound formed from Sn-Pb eutectic solder and copper in the case (1). FIG. 5 snows an appearance of an intermetallic compound formed from a nickel/gold electro plated surface and Sn-Pb eutectic solder in the case (3).

The interface reaction in the case of soldering for a nickel/gold electroless plated surface has been already found. More specifically, gold is diffused into solder (see "Soldering in electronics" issued by THE NIKKAN KOGYO SHIMBUN, LTD., p.201) and thereafter tin reacts with nickel to form the intermetallic compound (see "Soldering in electronics" issued by THE NTKKAN KOGYO SHIMBUN, LTD, p.98).

Figure 6:
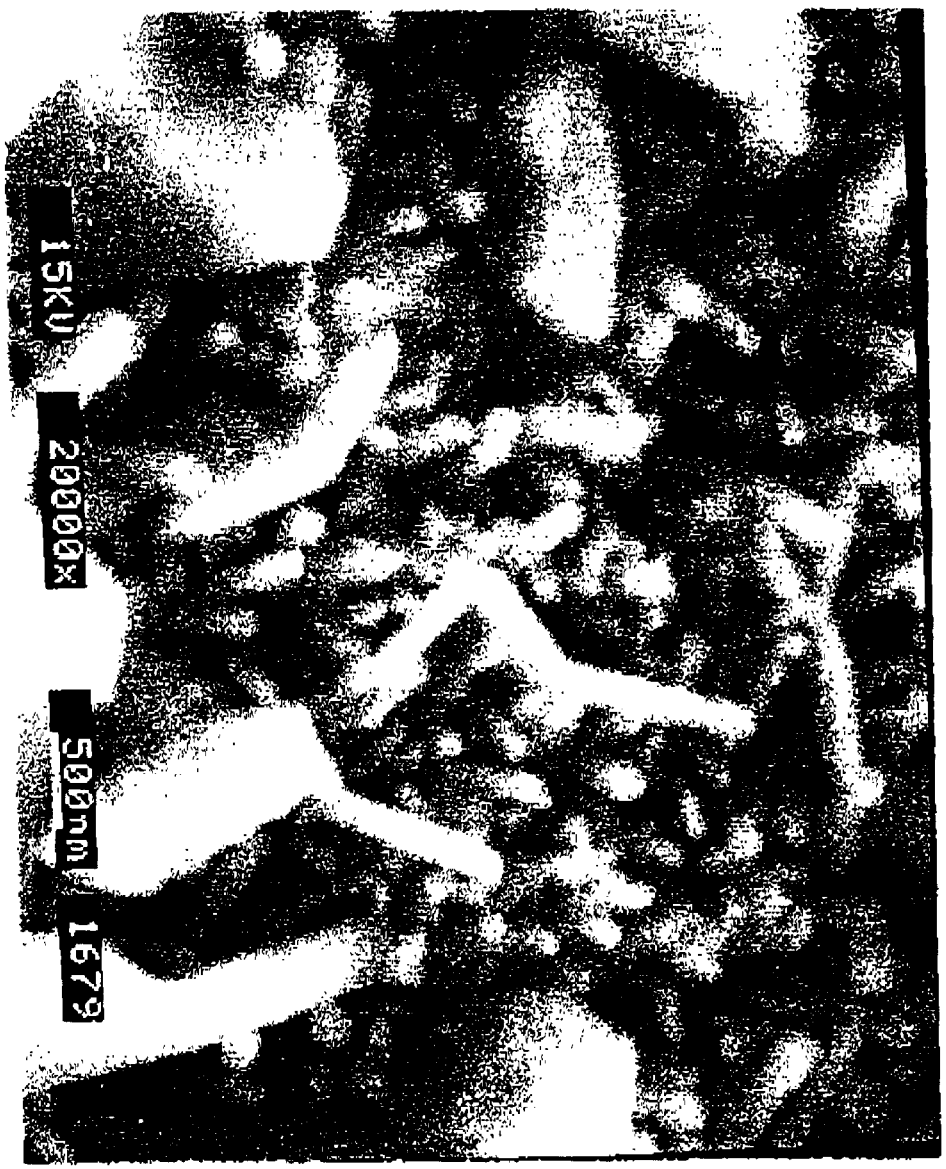
FIG. 6 is a diagram showing an appearance of a needle-like intermetallic compound formed from a nickel/gold electroless plated surface and Sn-Pb eutectic solder.

Further, the Inventors determined how the intermetallic compound varied depending on the kind of solder. As the result the Inventors found that, in the case of using Sn-Pb eutectic solder for a nickel/gold electroless plated surface a needle-like intermetallic compound of tin and nickel had been formed from the nickel surface (nickel layer) toward the solder as shown in FIG. 6. The Inventors further found that such a needle-like intermetallic compound was very easy to be peeled off the nickel surface (nickel layer).

Figure 7:
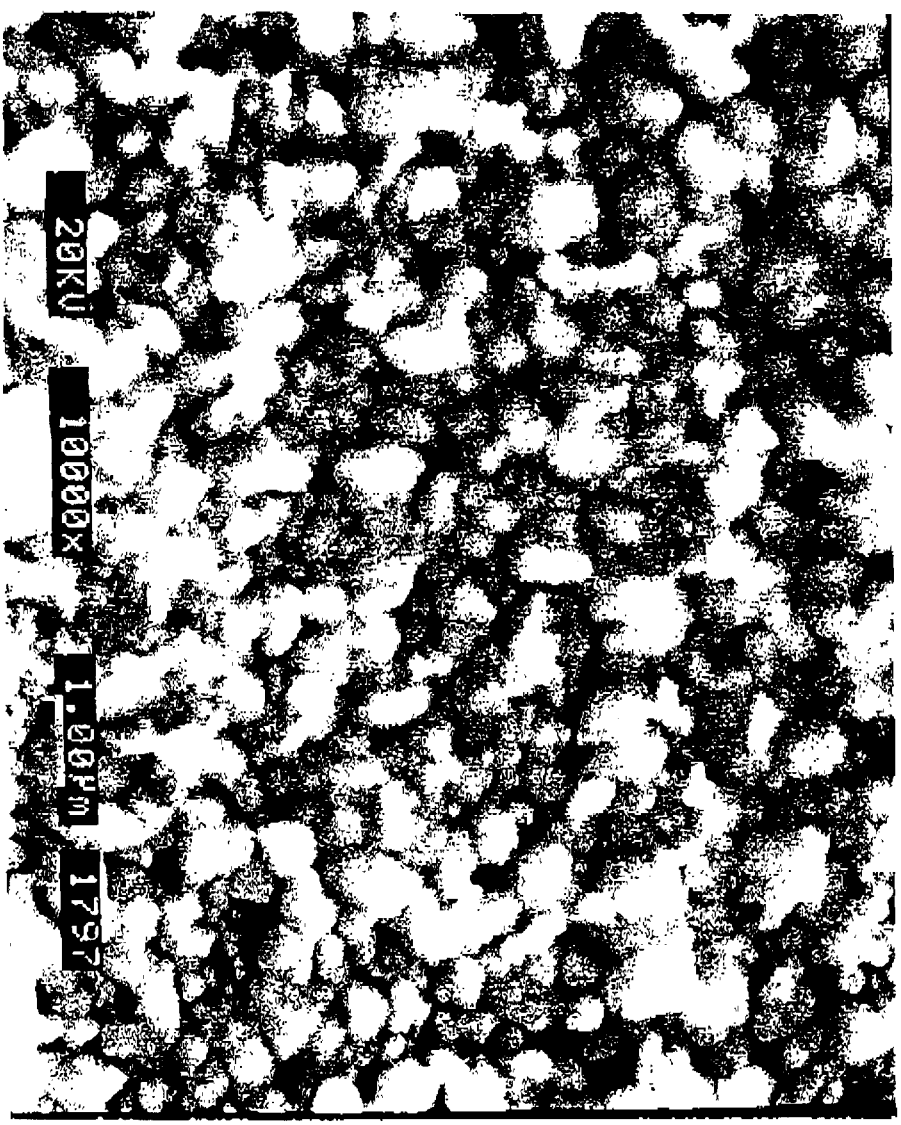
FIG. 7 is a diagram showing an appearance of a cauliflower-like intermetallic compound formed from a nickel/gold electroless plated surface and Sn—Ag—CU solder.

In contrast, according to the present invention, in the case where an Sn—Ag—Cu solder is used to form a solder joint, a cauliflower-shaped intermetallic compound composed mainly of tin and copper, further including nickel, had been formed at an interface surface between the solder layer and the nickel layer. as shown in FIG. 7.

The conclusion from the above studies is that the mechanical strength of a solder joint is closely associated with the appearance or shape of an intermetallic compound formed In the vicinity of an interface surface between nickel and solder layers. Especially, a high-strength solder joint is caused by a cauliflower-shaped intermetallic compound formed in the vicinity of an interface surface between nickel and solder layers. In other words, it is important to find a method for forming a cauliflower-shaped intermetallic compound so as to improve the joint strength.

As a consequence of the above studies, the Inventors decide that an Sn—Ag—CU solder is used to form a solder joint for a nickel/gold electroless plated surface.

EXAMPLES

Figure 8:
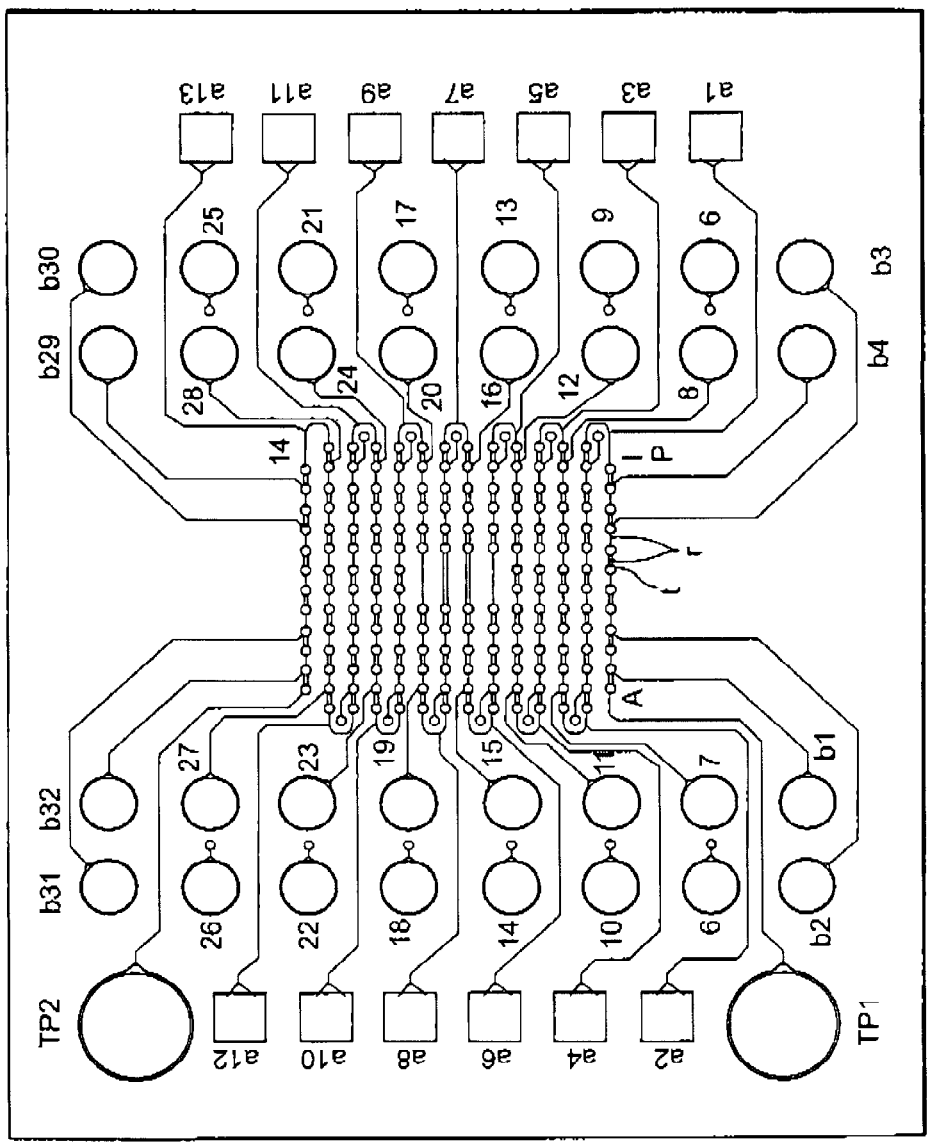
FIG. 8 is a diagram showing an example of a circuit pattern formed on a sample circuit board having parts mounted thereto.

To confirm that the embodiment provides a high-strength solder joint, a destructive lifetime inspection of samples A, B, C, and D was made under conditions as shown in the following table, taking as an example a printed circuit substrate as shown in FIG. 8.

TABLE

|  | SAMPLE A | SAMPLE B | SAMPLE C | SAMPLE D |
| --- | --- | --- | --- | --- |
| DEVICE TYPE | BGA | LGA | BGA | LGA |
| SOLDER BALL | Sn-Ag-Cu |  | Sn-Pb eutectic |  |
| SOLDER PASTE | Sn-Ag-Cu | Sn-Ag-Cu | Sn-Pb eutectic | Sn-Pb eutectic |
| REFLOW PEAK TEMP. (DEGREES CENTIGRADE) | 235 | 235 | 235 | 235 |

1. Substrates to be Inspected

A substrate to be inspected is formed by soldering electronic parts to a printed circuit substrate (100×40 mm). Here, as shown in the above table, four substrates having different compositions of solder and different types of mounted device (samples A. B. C, and D) are prepared. The details of solder and the printed circuit substrate are described hereafter. 1,1 Solder The samples A and B use an Sn—3.5 Ag—0.75 Cu % by weight solder. The samples C and D use an Sn-Pb eutectic solder in a comparative manner. Soldering was made at a reflow (peak) temperature 235 degrees Centigrade.
1.2 Electronic parts In this example, an electronic part having BGA (Ball Grid Array) or LGA (Land Grid Array) package is used. A pattern of terminals to be soldered is shown in FIG. 8, in which each terminal to be soldered is indicated by a lower-case letter "t" or a small circle.
1.3 Printed Circuit Substrate A pattern of terminals and wires made of copper is shown in FIG. 8. The terminals to be soldered, each indicated by a lower-case letter "t" or a small circle, are arranged like a lattice in the central portion of the printed circuit substrate. Registers each indicated by a lower-case letter "r" are connected between adjacent terminals to daisy-chain the terminals t. Each register is 1.1 to 1.4 ohm.

In FIG. 8, a register indicated by a double line is provided on the parts-mounting side of the printed circuit substrate and another register r indicated by a single line is provided on the other side thereof.

The terminals t to be soldered are connected to corresponding test pads indicated by TP1, TP2, a1, a2, . . . , a13, b1, b2, . . . , b32, respectively. These test pads are used to test for continuity between desired terminals.

As described before, each terminal t has already had a nickel/gold electroless plated layer formed thereon. Here, the nickel/gold electroless plated layer is composed of a nickel-plated layer 3–5 Mm (micrometer) thick and a gold-plated layer about 0.05 Mm (micrometer) thick. The thickness of nickel/gold layer is used in general and determined in view of its function (anticorrosion) and manufacturing cost. The nickel/gold electroless plated layer is formed by process steps 1–4 as described hereafter.

Process Step 1 (Pre-treatment)

The pretreatment was performed in the following order:
1) alkaline degreasing; 2) acid degreasing; 3) soft etching: 4)

desmut; 5) predipping; 6) addition of catalyst: and 7) post-dipping. The details will be described hereafter, The alkaline degreaslng is performed by brushing the printed circuit substrate in an alkaline cleaning liquid at a temperature of 65 degrees centigrade. After the alkaline degreasing process, water cleaning is performed twice. The acid degreasing is performed in an acid cleaning liquid at a temperature of 45 degrees centigrade for five minutes. Etching solution used in the soft etching process includes 100 g/L of sodium persulfate and 10 ml/L of 98% sulfuric acid. The etching is performed for one minute at a temperature of 25 degrees centigrade. After etching, water cleaning is performed twice. The desmut process is performed for one minute at a temperature of 25 degrees centigrade using a solution including 100 ml/L of 98% sulfuric acid. For predipping, the printed circuit substrate is let dipped into a solution including 100 ml/L of 35% hydrochloric acid for one minute at a temperature of 25 degrees centigrade. The addition of catalyst Is performed by dipping the printed circuit substrate into a solution for catalyst addition for one minute at a temperature of 25 degrees centigrade.

Process Step 2 (Nickel plating

The printed circuit substrate is treated by the nickel/gold electroless plating for 22 minutes at a temperature of 85 degrees centigrade, forming a nickel layer on each terminal t thereof (see FIG. 8). Thereafter, water cleaning is performed twice. Subsequently, pure water cleaning is performed. Since the nickel/gold electroless plating is a well-known technique, its description is omitted.

Process Step 1 (Gold plating)

The printed circuit substrate is treated by displacement plating for 7 minutes at a temperature of 85 degrees centigrade. forming a gold layer on the nickel layer formed by the process step 2 for each terminal t thereof. Thereafter, water cleaning is performed twice. Subsequently, pure water cleaning is performed. Since the displacement plating is a well-known technique, its description is omitted.

Process Step 4 (Post-treatment)

The printed circuit substrate having the nickel/gold plated terminals formed thereon is cleaned using pure water for one minute at a temperature of 25 degrees centigrade. Thereafter, the printed circuit substrate is dried with a dryer.

2. Test 2.1 Testing method

A bending test machine is used to conduct a repetitive bending test on the samples A, B, C, and D as shown in the above table.

2.2 Bending Test Machine

The repetitive bending test is conducted by the bending test machine provided by KEIWA Co. (Product No MSB76-12413)

2.3 Conditions

In the bending test, the supporting span and thepressed depth are set to 80 mm and 3 mm, respectively. The controller is set to a depressing rate of 30 mm/sec, an acceleration of 0.3 G, respective waits at uppermost and lowermost positions of 0.2 sec, and an operation period of 0.72 sec/cycle.

3. Evaluation Method

The resistance of each register connected across terminals t daisy-chained is monitored during the bending test. When the resistance increases 100% (equivalent to about 1 ohm), the printed circuit substrate is assumed to be destructed. The evaluation is made based on the number of times the printed circuit substrate has been bent until the destruction occurs.

4. Evaluation

At an early stage, the samples C and D using the conventional Sn-Pb eutectic solder were peeled off and destroyed at the interface surface of the solder Joint. More specifically, the sample D was peeled and destroyed by 3518 bendings. The sample C was peeled and destroyed by only 207 bendings.

Figure 9:
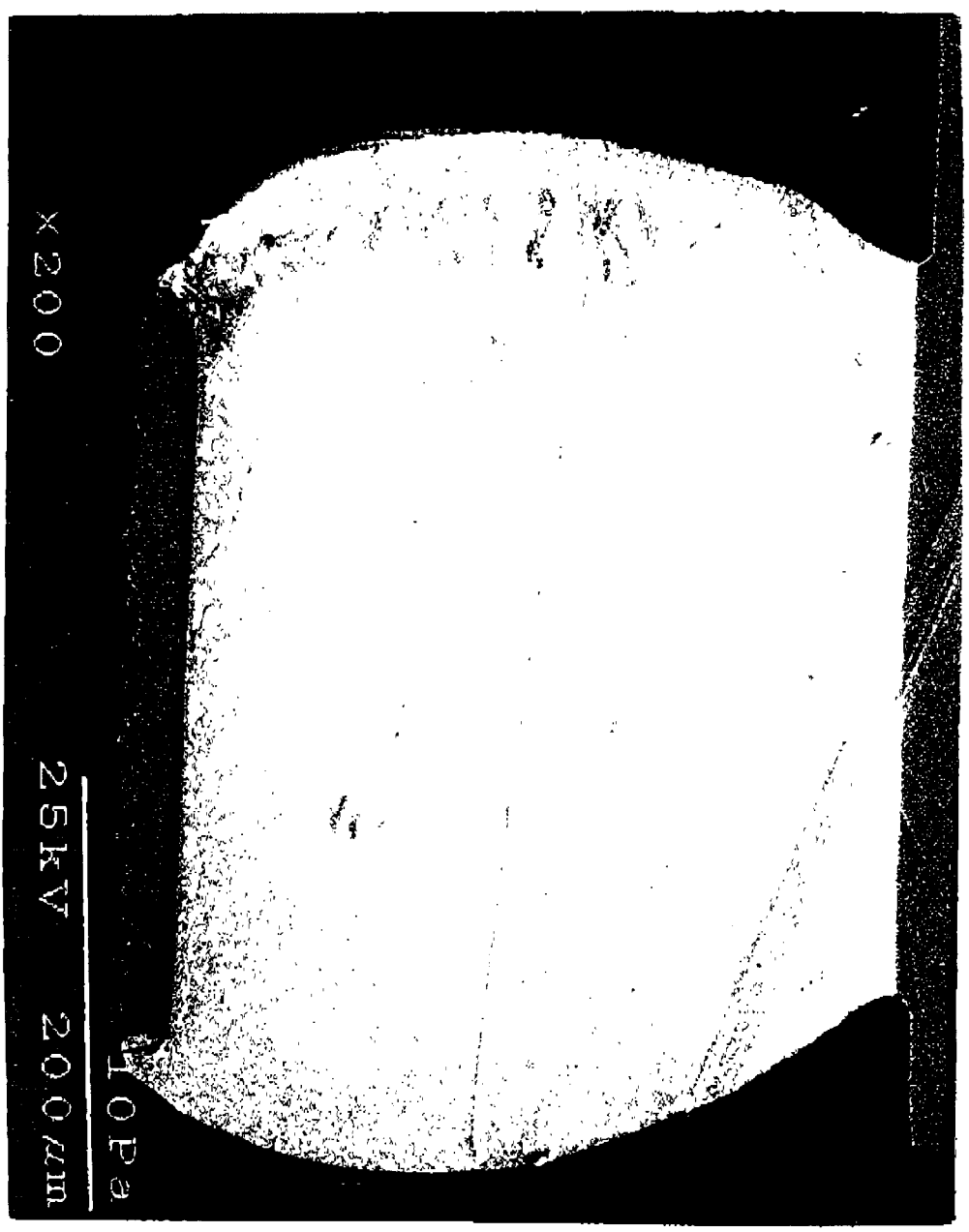
FIG. 9 is a diagram showing an appearance such that a solder joint formed from a nickel/gold electroless plated surface and Sn-Pb eutectic solder is peeled.
Figure 10:
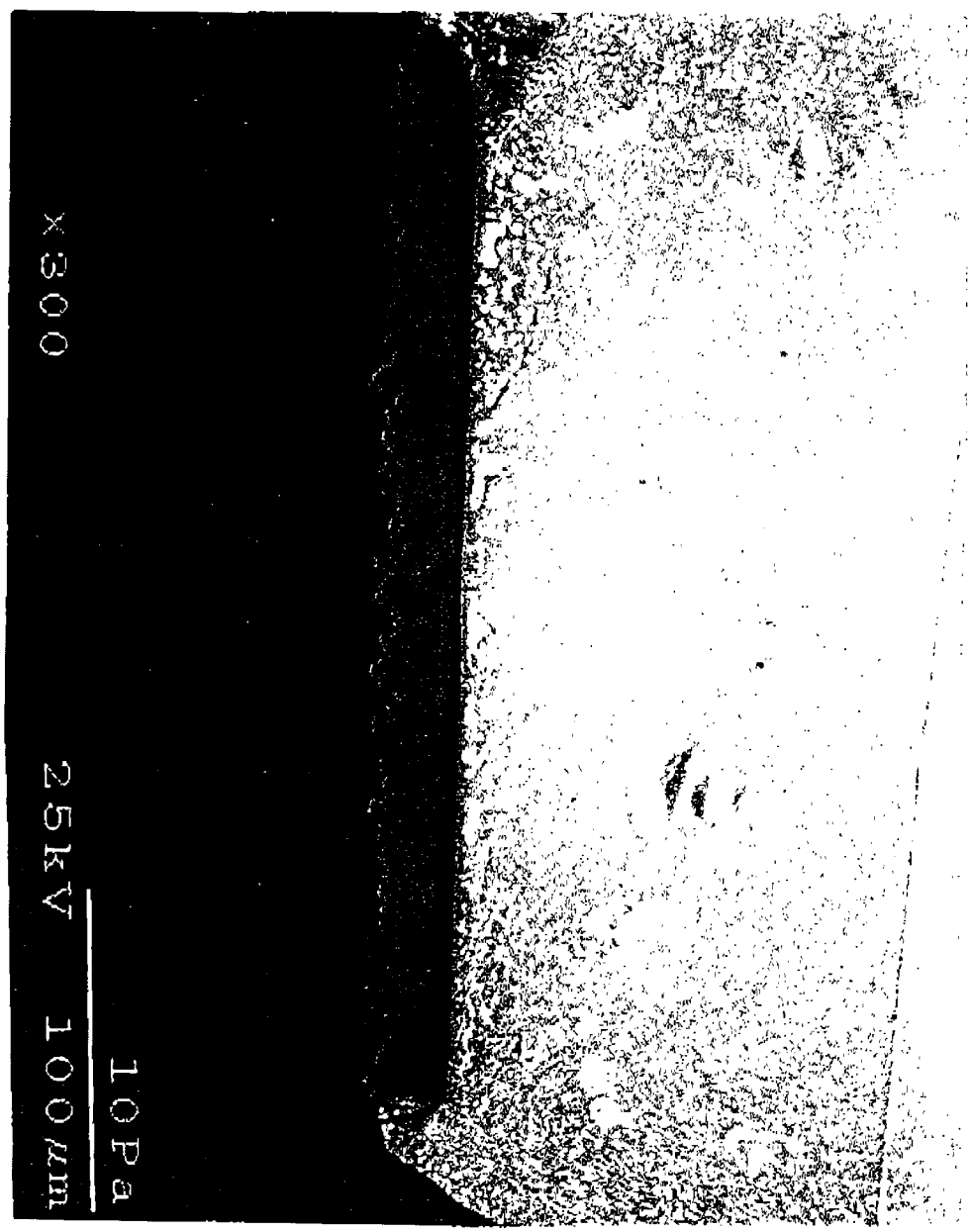
FIG. 10 is an enlarged diagram showing a peeled solder joint of FIG. 9.

FIGS. 9 and 10 show an appearance of a peeled solder joint of the sample C. At the solder joint of the samnple C, the solder is peeled off the interface surface of the nickel layer. In FIG. 10, the spotted light gray portion (the upper half) thereof is the solder, which is peeled off at the lower end surface of the spotted light gray portion.

In contrast, in the samples A and B using the Sn—Ag—CU solder according to the present embodiment, the above peel-off phenomenon did not occur. More specifically, the insulating layer of the sample A was destructed by 20000 bendings but the solder Joint was not peeled off the interface surface of the nickel layer. The solder of the sample A was cracked by 6341 bendings but the solder joint was not peeled off the interface surface of the nickel layer Accordingly, an Sn—Ag—CU solder for the nickel/gold electroless plated layer causes a high-strength solder joint, resulting in improved reliability of a solder joint.

It is to be understood that the present invention is not limited to the specific embodiments as described above and that various changes and modifications may be made In the invention without departing from the spirit and scope thereof.

For example, an Sn—Ag—CU solder is not limited to the Sn—3.5 Ag—0.75 Cu solder used in the embodiment. The composition of Sn—Ag—CU solder can be determined within a wide range providing the same advantage.

In FIG. 1, the underlaid layer 1 on which a nickel/gold eLectroless plated layer is to be formed is not limited to a copper wire. The underlaid layer 1 may be a metal or a non-metal. A combination of the Sn—Ag—CU solder and the nickel/gold electroless plated layer provides the advantages of the present invention.

The gold layer plated on the nickel layer is diffused into solder when soldering- Since gold is chemically stable, gold diffused into the solder is considered to be in the same state independently of a plating method. Therefore, even if the shape of a gold-plated layer varies depending on a plating method, this variation would not affect the mechanical strength of a solder joint. In other words, a gold layer electroplated on the nickel layer may provide the same advantages of the present invention.

The present invention may be applied to various soldering scenes for the nickel/gold electroless plated surface. For example, the present invention can be applied to the case where a CSP device (semiconductor device) is surface-mounted to a printed circuit substrate by soldering. The present invention can be also applied to Flip Chip Bonding (FCB). More specifically, a nickel/gold electroless plated bump can be formed and then soldered using an Sn—Ag—CU solder to make a solder joint. Furthermore, a diffused barrier layer is formed by nickel/gold electroless plating and an Sn—Ag—CU solder ball can be placed and soldered on the barrier layer to make a solder joint. The present invention can be effectively applied to these cases.

What is claimed is:

1. A soldering method comprising the steps of:
 preparing a nickel/gold electroless plated layer composed of a nickel layer formed by nickel-phosphorus electroless plating and a gold layer formed on the nickel layer; and soldering the nickel/gold electroless plated layer using a solder so that an intermetallic compound is formed at an interface surface between the nickel layer and the solder, wherein the intermetallic compound is shaped like a cauliflower as seen under magnification.

2. The soldering method according to claim 1, wherein the intermetallic compound Is composed mainly of tin (Sn) and copper (Cu), further Including nickel (Ni).

3. The soldering method according to claim 1, wherein the gold layer is formed by displacement plating.

4. The soldering method according to claim 2, wherein the gold layer is formed by displacement plating.

5. A method for forming a wiring structure having a plurality of conductor terminals formed thereon, comprising the steps of:

forming a nickel/gold electroless plated layer on each of the conductor terminals, wherein the nickel/gold electroless plated layer is composed of a nickel layer formed by nickel-phosphorus electroless plating and a gold layer formed on the nickel layer soldered; and soldering the nickel/gold electroless plated layer using a solder so that an intermetallic compound is formed at an interface surface between the nickel layer and the solder, wherein the intermetallic compound is shaped like a cauliflower as seen under magnification.

6. The method according to claim 5, wherein the lntermetallic compound is composed mainly of tin (Sn) and copper (Cu), further including nickel (Ni).

7. The method according to claims 6, wherein the gold layer is formed by displacement plating.

8. The method according to claim 5, wherein the gold layer is formed by displacement plating.

9. A method for forming a device comprising:

a wiring substrate having a plurality of substrate terminals formed thereon; and a functional circuit having a plurality of circuit terminals, wherein the substrate terminals are connected to respective ones of the circuit terminals, the method comprising the steps of:

forming a nickel/gold electroless plated layer on each of the substrate terminals, wherein the nickel/gold electroless plated layer is composed of a nickel layer formed by nickel- phosphorus electroless plating and a gold layer formed on the nickel layer soldered; and soldering the nickel/gold electroless plated layers on the substrate terminals to respective ones of the circuit terminals using a solder so that an intermetallic compound is formed at an interface surface between the nickel layer and the solder, wherein the intermetallic compound is shaped like a cauliflower as seen under magnification.

10. The method according to claim 9, wherein the intermetallic compound is composed mainly of tin (Sn) and copper (Cu), further including nickel (Ni).

11. A method for forming a device comprising:

a printed circuit substrate having a plurality of substrate terminals formed thereon; and a semiconductor chip package having a plurality of package terminals, wherein the substrate terminals are connected to respective ones of the package terminals, the method comprising the steps of:

forming a nickel/gold electroless plated layer on each of the corresponding substrate terminal and a corresponding package terminal, wherein the nickel/gold electroless plated layer is composed of a nickel layer formed by nickel-phosphorus electroless plating and a gold layer formed on the nickel layer; and soldering the nickel/gold electroless plated layers on each of a corresponding substrate terminal and a corresponding package terminal to connect them, using a solder so that an intermetallic compound is formed at an interface surface between the nickel layer and the solder, wherein the intermetallic compound is shaped like a cauliflower as seen under magnification.

12. The method according to claims 11, wherein the intermetallic compound is composed mainly of tin (Sn) and copper (Cu), further including nickel (Ni).

* * * * *